United States Patent [19]
Fujii

[11] Patent Number: 5,742,628
[45] Date of Patent: Apr. 21, 1998

[54] SHORT WAVELENGTH LASER EMITTING DIODE WITH AN IMPROVED GAN SYSTEM DOUBLE HETEROSTRUCTURE

[75] Inventor: Hiroaki Fujii, Tokyo, Japan

[73] Assignee: NEC Corporation, Tokyo, Japan

[21] Appl. No.: 650,439

[22] Filed: May 20, 1996

[30] Foreign Application Priority Data

May 19, 1995 [JP] Japan .................................. 7-121878

[51] Int. Cl.⁶ .................................................. H01S 3/19
[52] U.S. Cl. .................................................. 372/45; 257/77
[58] Field of Search ........................ 372/45, 46; 257/13, 257/77

[56] References Cited

U.S. PATENT DOCUMENTS

| | | | |
|---|---|---|---|
| 5,247,533 | 9/1993 | Okazaki et al. | 372/45 |
| 5,432,808 | 7/1995 | Hatano et al. | 372/45 |
| 5,585,648 | 12/1996 | Tischler | 372/45 |
| 5,604,763 | 2/1997 | Kato et al. | 372/45 |

FOREIGN PATENT DOCUMENTS

| | | |
|---|---|---|
| 0 460 710 | 12/1991 | European Pat. Off. . |
| 0 599 224 | 6/1994 | European Pat. Off. . |
| 0 609 799 | 8/1994 | European Pat. Off. . |
| 7-122520 | 5/1995 | Japan . |

OTHER PUBLICATIONS

Sasaki et al., "Substrate–Orientation Dependence of GaN Single–Crystal Films Grown by Metalorganic Vapor–Phase Epitaxy", *J. Appl. Phys.*, vol. 61, No. 7, Apr. 1987, pp. 2533–2540.

Kato et al., "Selective Growth of Wurtzite GaN and $Al_xGa_{1-x}N$ on GaN/Sapphire Substrates by Metalorganic Vapor Phase Epitaxy", *Journal of Crystal Growth*, vol. 144, No. 3/4, Dec. 1994, pp. 133–140.

Tanaka et al., "Selective Growth of Gallium Nitride Layers with a Rectangular Cross–Sectional Shape and Stimulated Emission from the Optical Waveguides Observed by Photopumping", *Applied Physics Letters*, vol. 68, No. 7, Feb. 1996, pp. 976–978.

Y. Ueno et al., "Stable 30 mW Operation at 50°C for Strained MQW AlGaInP Visible Laser Diodes", *Electronic Letters*, Apr. 23, 1992, vol. 28, No. 9, pp. 860–861.

S. Nakamura et al., Candela–class high–brightness InGaN/AlGaN double–heterostructure blue–light–emitting diodes, *Appl. Phys. Lett.*, vol. 64, No. 13, Mar. 28, 1994, pp. 1687–1689.

Primary Examiner—James W. Davie
Attorney, Agent, or Firm—Young & Thompson

[57] ABSTRACT

A GaN system compound semiconductor double heterostructure in a light emission device comprises an active layer sandwiched between first and second cladding layers. Those three layers are made of GaN system compound semiconductor materials. The first, second and third GaN system compound semiconductor materials have first, second and third hexagonal crystal structures of basal planes tilted from a (0001) plane by an angle in the range of 0 degree to a few degrees, and the basal planes are substantially parallel to interfaces of the active layer to the first and second cladding layers. The GaN system compound semiconductor double heterostructure have a pair of opposite resonance faces vertical to a direction in which a light is emitted, and for each of the first, second and third hexagonal crystal structures, a pair of opposite planes in the six planes vertical to the basal plane forms the opposite resonance faces.

37 Claims, 3 Drawing Sheets

1: GaInN/AlGaN MQW active layer
2: n-AlGaN cladding layer
3: p-AlGaN cladding layer
4: n-GaN layer
5: p-GaN layer
6: n-GaN layer
7: GaN buffer layer
8: SiO₂ mask
9: sapphire substrate 21: Zn-doped InGaN active layer
22: n-AlGaN cladding layer
23: p-AlGaN cladding layer
24: n-GaN layer
25: GaN buffer layer
26: p-GaN layer
27: sapphire substrate
28: n-electrode
29: p-electrode ○ :Group-III elements (Ga, In, Al, etc.)
□ :Group-V element (N)

1: GaInN/AlGaN MQW active layer
2: n-AlGaN cladding layer
3: p-AlGaN cladding layer
4: n-GaN layer
5: p-GaN layer
6: n-GaN layer
7: GaN buffer layer
8: SiO$_2$ mask
9: sapphire substrate

SHORT WAVELENGTH LASER EMITTING DIODE WITH AN IMPROVED GAN SYSTEM DOUBLE HETEROSTRUCTURE

BACKGROUND OF THE INVENTION

The present invention relates to a semiconductor laser diode, and more particularly to a laser diode with a GaN system semiconductor double-heterostructure emitting a laser beam having a wavelength in a range of blue light to ultraviolet ray, which might be useful as a light source for high density optical disc devices in a generation after next.

Developments for AlGaInP system high power and red light emission semiconductor laser diodes have been successful as light sources for high density optical disc devices in the next generation. The red light emission laser diodes are disclosed in Ueno et al. *ELECTRONICS LETTERS* 23rd, April 1992 Vol. 28 No. 9 pp. 860–861. In order to raise a density of the optical disc, short wavelength laser beams such as blue light or ultraviolet rays are required in place of long wavelength laser beams such as red light. In order to realize such short wavelength laser beams as blue light or ultraviolet ray, ZnSe system semiconductor laser emission diodes or GaN system semiconductor laser emission diodes are available. Fox the former ZnSe system semiconductor laser emission diodes, a laser structure has already been realized but is likely to have performance shortcomings due to crystal defects. That is why it would be difficult to consider that the ZnSe system semiconductor laser emission diodes are suitable as a light source for the high density optical disc in the next generation.

On the other hand, the latter GaN system semiconductor laser emission diodes are more attractive due to their high reliability and high brightness. Candela-class high-brightness InGaN/AlGaN double-heterostructure blue-light-emitting diodes are disclosed in S. Nakamura et al. *Appl. Phys. Lett.* 64(13), pp. 1687–1688, 28 Mar. 1994. FIG. 1 illustrates such candela-class high-brightness InGaN/AlGaN double-heterostructure blue-light-emitting diode. The laser diode is formed on a sapphire substrate 27. A GaN buffer layer 25 is grown on the sapphire substrate 27. A thick nGaN layer 24 is grown on the GaN buffer layer 25. An n-electrode 28 is formed on a part of the thick n-GaN layer 24. An n-AlGaN cladding layer 22 is grown on the other part of the thick n-GaN layer 24. A Zn-doped InGaN active layer 21 is grown on the n-AlGaN cladding layer 22. A p-AlGaN cladding layer 23 is grown on the Zn-doped InGaN active layer 21. The Zn-doped InGaN active layer 21 is sandwiched between the n-AlGaN cladding layer 22 and the p-AlGaN cladding layer 23 to form a double heterostructure acting as a resonator. A p-GaN layer 26 is grown on the p-AlGaN cladding layer 23. A p-electrode 29 is provided on the p-GaN layer 26.

GaN system compound semiconductors have hexagonal crystal structures, for which reason hexagonal crystal structures are likely to be more difficult to form resonance faces of the resonator in a cleavage method than cubic crystal structures. In the prior art, it was difficult to realize the structure of the resonator in the light emission diodes. Namely, the hexagonal crystal structures of GaN system compound semiconductors make it difficult to form laser emission diodes with the resonator made of GaN system compound semiconductors.

Although a dry etching to form vertical resonance surfaces of the resonator of the laser emission diodes was attempted cutting the hexagonal crystal structures of GaN system compound semiconductors is difficult due to its high corrosion resistance.

Alternatively, forming ultrathin reflective multilayers for a surface emission laser was also tried. Needless to say, in this case, precise control of growth of ultrathin reflective multilayers is required. Actually, however, is it difficult to form precisely ultrathin layers made of GaN system compound semiconductors.

In the above circumstances, it seems difficult to achieve success in forming GaN system compound semiconductors actually operational and possessing the desired performances.

SUMMARY OF THE INVENTION

Accordingly, it is an object of the present invention to provide a GaN system compound semiconductor double heterostructure acting as a resonator in a laser emission device free from the problems and disadvantages as described above.

It is another object of the present invention to provide a specific crystal structure of GaN system compound semiconductors of a double heterostructure acting as a resonator in a laser emission device.

It is still another object of the present invention to provide a laser emission device with an improved GaN system compound semiconductor double heterostructure acting as a resonator.

It is further another object of the present invention to provide a laser emission device with a double heterostructure acting as a resonator made of GaN system compound semiconductors having a specific crystal structure.

The above and other objects, features and advantages of the present invention will be apparent from the following descriptions.

The present invention provides a GaN system compound semiconductor double heterostructure in a light emission device. The GaN system compound semiconductor double heterostructure comprises the following three layers. A first cladding layer of a first conductivity type is made of a first GaN system compound semiconductor material having a first energy band gap. An active layer is provided in contact with the first cladding layer. The active layer is made of a second GaN system compound semiconductor material which has a second energy band gap being smaller than the first energy band gap of the first cladding layer. A second cladding layer of a second conductivity type is provided in contact with the active layer. The second cladding layer is made of a third GaN system compound semiconductor material which has a third energy band gap larger than the second energy band gap of the active layer.

It is important for the present invention that the first, second and third GaN system compound semiconductor materials have first, second and third hexagonal crystal structures of basal planes tired from a (0001) plane by an angle in the range of 0 degree to a few degrees, and the basal planes are substantially parallel to interfaces of the active layer to the first and second cladding layers.

In addition, the GaN system compound semiconductor double heterostructure may have a pair of opposite resonance faces vertical to a direction in which a light is emitted, and for each of the first, second and third hexagonal crystal structures, a pair of opposite planes in the six planes vertical to the basal plane forms the opposite resonance faces.

The present invention also provides a resonator structure for emitting a light in a light emission device. The resonator structure comprises the following constitutional elements. A first compound semiconductor epitaxial layer of a first conductivity type is provided. A first electrode is provided to be electrically connected with the compound semiconductor epitaxial layer. A GaN system compound semiconductor double heterostructure is selectively grown on the first compound semiconductor epitaxial layer to be spaced apart from the first electrode. The GaN system compound semiconductor double heterostructure comprises the following three layers. A first cladding layer of the first conductivity type is provided on the semiconductor buffer layer. The first cladding layer is made of a first GaN system compound semiconductor material having a first energy band gap. An active layer is provided on the first cladding layer. The active layer is made of a second GaN system compound semiconductor material which has a second energy band gap being smaller than the first energy band gap of the first cladding layer. A second cladding layer of a second conductivity type is provided on the active layer. The second cladding layer is made of a third GaN system compound semiconductor material which has a third energy band gap being larger than the second energy band gap of the active layer. A second compound semiconductor epitaxial layer of the second conductivity type is provided on the second cladding layer. A second electrode is provided to be electrically connected with the second compound semiconductor epitaxial layer.

It is important for the present invention that the first, second and third GaN system compound semiconductor materials have first, second and third hexagonal crystal structures of basal planes tilted from a (0001) plane by an angle in the range of 0 degree to a few degrees, and the basal planes are substantially parallel to interfaces of the active layer to the first and second cladding layers.

In addition, the GaN system compound semiconductor double heterostructure may have a pair of opposite resonance faces vertical to a direction in which a light is emitted, and for each of the first, second and third hexagonal crystal structures, a pair of opposite planes in the six planes vertical to the basal plane forms the opposite resonance faces.

The present invention also provides a light emission device comprising the following constitutional elements. A semiconductor buffer layer is provided on a substrate. A first compound semiconductor epitaxial layer of a first conductivity type is provided on the semiconductor buffer layer which has first and second areas apart from each other. A first electrode is provided on the first area of the first compound semiconductor epitaxial layer. A GaN system compound semiconductor double heterostructure is provided on the second area of the first compound semiconductor epitaxial layer to be spaced apart from the first electrode. The GaN system compound semiconductor double heterostructure comprises the following three layers. A first cladding layer of the first conductivity type is provided on the semiconductor buffer layer. The first cladding layer is made of a first GaN system compound semiconductor material which has a first energy band gap. An active layer is provided on the first cladding layer. The active layer is made of a second GaN system compound semiconductor material which has a second energy band gap being smaller than the first energy band gap of the first cladding layer. A second cladding layer of a second conductivity type is provided on the active layer. The second cladding layer is made of a third GaN system compound semiconductor material which has a third energy band gap larger than the second energy band gap of the active layer. A second compound semiconductor epitaxial layer of the second conductivity type is provided on the second cladding layer. A second electrode is provided in contact with the second compound semiconductor epitaxial layer.

In addition, the GaN system compound semiconductor double heterostructure may have a pair of opposite resonance faces vertical to a direction in which a light is emitted, and for each of the first, second and third hexagonal crystal structures, a pair of opposite planes in the six planes vertical to the basal plane forms the opposite resonance faces.

BRIEF DESCRIPTIONS OF THE DRAWINGS

Preferred embodiments of the present invention will be described in detail with reference to the accompanying drawings.

DISCLOSURE OF THE INVENTION

The present invention provides a GaN system compound semiconductor double heterostructure in a light emission device. The GaN system compound semiconductor double heterostructure comprises the following three layers. A first cladding layer of a first conductivity type is made of a first GaN system compound semiconductor material having a first energy band gap. An active layer is provided in contact with the first cladding layer. The active layer is made of a second GaN system compound semiconductor material which has a second energy band gap being smaller than the first energy band gap of the first cladding layer. A second cladding layer of a second conductivity type is provided in contact with the active layer. The second cladding layer is made of a third GaN system compound semiconductor material which has a third energy band gap larger than the second energy band gap of the active layer.

It is important for the present invention that the first, second and third GaN system compound semiconductor materials have first, second and third hexagonal crystal structures of basal planes tilted from a (0001) plane by an angle in the range of 0 degree to a few degrees, and the basal planes are substantially parallel to interfaces of the active layer to the first and second cladding layers.

The GaN system compound semiconductor double heterostructure forms a resonator having a pair of opposite resonance faces vertical to a direction in which a light is emitted, and for each of the first, second and third hexagonal crystal structures, a pair of opposite planes in the six planes vertical to the basal plane forms the opposite resonance faces. In this case, the pair of opposite planes in the six planes vertical to the basal plane comprises (10-10) plane and (-1010) plane. Alternatively, the pair of opposite planes in the six planes vertical to the basal plane may comprise (01-10) plane and (0-110) plane. Further alternatively, the pair of opposite planes in the six planes vertical to the basal plane may comprise (-1100) plane and (1-100) plane.

Figure 1:
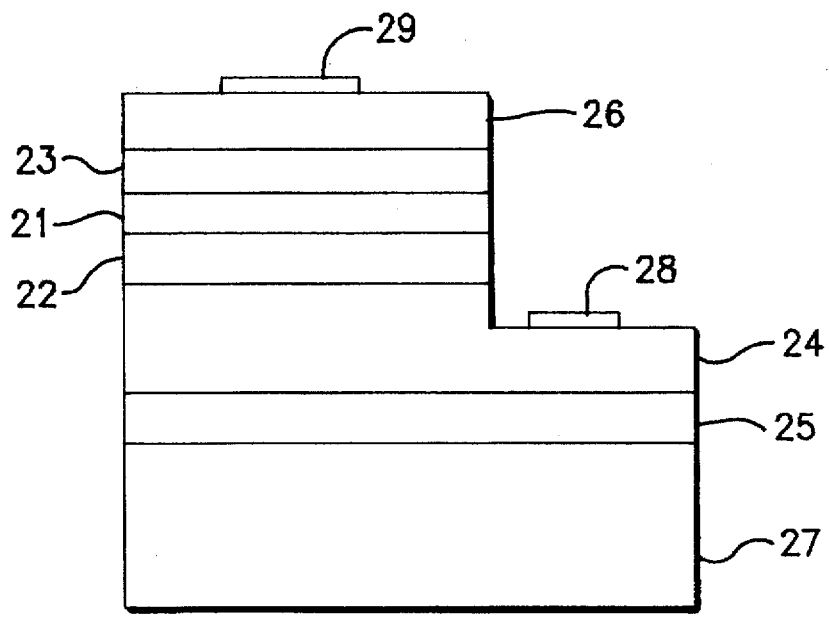
FIG. 1 is a cross-sectional elevation view illustrative of the conventional InGaN/AlGaN double heterostructure laser emission diode.
Figure 2A:
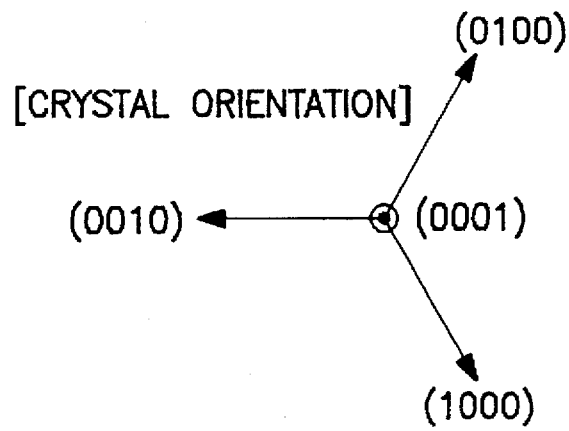
FIG. 2A is a view illustrative of a relationship between four plane orientations and their Miller indices in a hexagonal crystal structure of GaN system compound semiconductor.
Figure 2B:
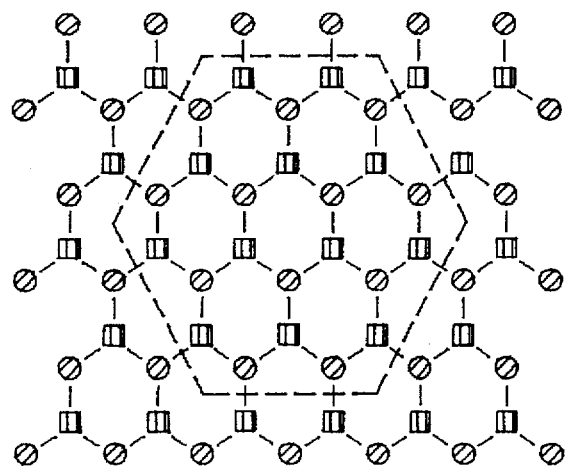
FIG. 2B is a view illustrative of atomic bonding between Group III elements and Group V elements in a hexagonal crystal structure of GaN system compound semiconductor.

As illustrated in FIGS. 2A and 2B, the hexagonal crystal structure has a basal plane which is tilted from a (0001)

plane by an angle in the range of 0 degree to a few degrees. The (0001) plane may be defined as a plane from which three dangling bonds of the Group-V element or N are extend upwardly or in an opposite direction to the substrate. As illustrated in FIG. 2A, a direction vertical to interface of the active layer to the first or second cladding layer is defined as an orientation (0001). In this case, there are three orientation vectors (1000), (0100) and (0001), each of which is vertical to the orientation (0001). In the hexagonal crystal structure, a surface orientation is defined by four Miller indices. FIG. 2B illustrates a plane view of the hexagonal crystal structure has a basal plane of (0001). Group-III elements form a top atomic layer of the hexagonal crystal on crystal growth. Group-V elements, or N, form a second top atomic layer of the hexagonal crystal on crystal growth. Group-III elements forming the top atomic layer are bonded via three dangling bonds to Group-V elements, or N, forming the second top atomic layer.

It will be considered as one example to carry out a selective growth of GaN using a mask having an opening of a circle. In this case, a hexagonal pillar of GaN is grown, which has a basal plane of (0001) and six planes vertical to the basal plane wherein crystal a growth rate of GaN on the six vertical planes is much slower than a crystal growth rate of GaN on the basal plane. That is why a metal organic vapor phase epitaxy is normally used to grow a GaN hexagonal crystal structure on a Group-V stabilized plane having been formed by supplying an excess amount of Group-V element gas at an initial time interval. On the basal plane (0001), nitrogen atoms' as Group-V elements, form a stabilized plane from which three dangling bonds of each of nitrogen atoms are projected upwardly. When Group-III elements are arrived on the Group-V element plane projecting upwardly three dangling bonds of each of nitrogen atoms, then Group-III elements will be bonded at a high probability or a high bonding coefficient. By contrast, the hexagonal crystal structure of GaN has the six planes vertical to the basal plane projecting outwardly two dangling bonds of each of nitrogen atoms, wherein the six vertical planes comprise a (10-10) plane, a (-1010) plane, a (01-10) plane, a (0-110) plane, a (-1100) plane and a (1-100) plane. Since two dangling bonds of each Group-V element, N, are projected from the six vertical planes, a bonding probability of Group-III elements to Group-V element on the six vertical plane is lower than when Group-III elements are bonded to Group-V element on the basal plane. Further there is a possibility that Group-III elements once bonded to Group-V elements on the six vertical planes will be eliminated therefrom. For those reasons, a probability of bonding Group-III elements to Group-V elements on the basal plane is much higher than a probability of bonding Group-III elements to Group-V elements on the six vertical planes. As a result, the hexagonal crystal of GaN having a basal plane (0001) can be grown.

Further, it is advantageously optional that the first, second and third GaN system compound semiconductor materials mainly include ones selected from the group consisting of GaN, GaInN, AlGaN and AlGaInN.

It is still further preferable that the first, second and third hexagonal crystal structures are identical, and basal planes of the first, second and third hexagonal crystal structures are parallel to each other and the first.

It is yet further preferable that the first and third GaN system compound semiconductor materials of the first and second cladding layers are identical with each other.

Furthermore, it is also advantageously optional that the active layer comprises a single quantum well layer.

Alternatively, it is also advantageously optional that the active layer comprises multiple quantum well layers. In this case, the multiple quantum well layers may comprise alternating laminations of GaInN well layers and AlGaN potential barrier layers.

The present invention also provides a resonator structure for emitting a light in a light emission device. The resonator structure comprises the following constitutional elements. A first compound semiconductor epitaxial layer of a first conductivity type is provided. A first electrode is provided to be electrically connected with the compound semiconductor epitaxial layer. A GaN system compound semiconductor double heterostructure is selectively grown on the first compound semiconductor epitaxial layer to be spaced apart from the first electrode. The GaN system compound semiconductor double heterostructure comprises the following three layers. A first cladding layer of the first conductivity type is provided on the semiconductor buffer layer. The first cladding layer is made of a first GaN system compound semiconductor material having a first energy band gap. An active layer is provided on the first cladding layer. The active layer is made of a second GaN system compound semiconductor material which has a second energy band gap being smaller than the first energy band gap of the first cladding layer. A second cladding layer of a second conductivity type is provided on the active layer. The second cladding layer is made of a third GaN system compound semiconductor material which has a third energy band gap being larger than the second energy band gap of the active layer. A second compound semiconductor epitaxial layer of the second conductivity type is provided on the second cladding layer. A second electrode is provided 1o be electrically connected with the second compound semiconductor epitaxial layer.

It is important for the present invention that the first, second and third GaN system compound semiconductor materials have first, second and third hexagonal crystal structures of basal planes tilted from a (0001) plane by an angle in the range of 0 degree to a few degrees, and the basal planes are substantially parallel to interfaces of the active layer to the first and second cladding layers.

The GaN system compound semiconductor double heterostructure may have a pair of opposite resonance faces vertical to a direction in which a light is emitted, and for each of the first, second and third hexagonal crystal structures, a pair of opposite planes in the six planes vertical to the basal plane forms the opposite resonance faces. In this case, the pair of opposite planes in the six planes vertical to the basal plane comprises (10-10) plane and (-1010) plane. Alternatively, the pair of opposite planes in the six planes vertical to the basal plane may comprise (01-10) plane and (0-110) plane. Further alternatively, the pair of opposite planes in the six planes vertical to the basal plane may comprise (-1100) plane and (1-100) plane.

As illustrated in FIGS. 2A and 2B, the hexagonal crystal structure has a basal plane which is tilted from a (0001) plane by an angle in the range of 0 degree to a few degrees. The (0001) plane may be defined as a plane from which three dangling bonds of the Group-V element or N are extend upwardly or in an opposite direction to the substrate. As illustrated in FIG. 2A, a direction vertical to interface of the active layer to the first or second cladding layer is defined as an orientation (0001). In this case, there are three orientation vectors (1000), (0100), and (0001), each of which is vertical to the orientation (0001). In the hexagonal crystal structure, a surface orientation is defined by four Miller indices. FIG. 2B illustrates a plane view of the hexagonal crystal structure has a basal plane of (0001).

Group-III elements form top atomic layer of the hexagonal crystal on crystal growth. Group-V elements, or N, form a second top atomic layer of the hexagonal crystal on crystal growth. Group-III elements forming thee top atomic layer are bonded via three dangling bonds to Group-V elements., or N, forming the second top atomic layer.

It will be considered as one example to carry out a selective growth of GaN using a mask having an opening of a circle. In this case, a hexagonal pillar of GaN is grown, which has a basal plane of (0001) and six planes vertical to the basal plane wherein a crystal growth rate of GaN on the six vertical planes is much slower than a crystal growth rate of GaN on the basal plane. That is why a metal organic vapor phase epitaxy is normally used to grow a GaN hexagonal crystal structure on a Group-V stabilized plane having been formed by supplying an excess amount of Group-V element gas at an initial time interval. On the basal plane (0001), nitrogen atoms as Group-V element forms a stabilized plane from which three dangling bonds of each of nitrogen atoms are projected upwardly. When Group-III elements are deposited on the Group-V element plane projecting upwardly three dangling bonds of each of nitrogen atoms, then Group-III elements will be bonded at a high probability or a high bonding coefficient. By contrast, the hexagonal crystal structure of GaN has the six planes vertical to the basal plane projecting outwardly two dangling bonds of each of nitrogen atoms, wherein the six vertical planes comprise a (10-10) plane, a (-1010) plane, a (01-10) plane, a (0-110) plane, a (-1100) plane and a (1-100) plane. Since two dangling bonds of each Group-V element, N, are projected from the six vertical planes, a bonding probability of Group-III elements to Group-V element on the six vertical plane is lower than when Group-III elements are bonded to Group-V element on the basal plane. Further there is a possibility that Group-III elements once bonded to Group-V elements on the six vertical planes will be eliminated therefrom. For those reasons, a probability of bonding Group-III elements to Group-V elements on the basal plane is much higher than a probability of bonding Group-III elements to Group-V elements on the six vertical planes. As a result, the hexagonal crystal of GaN having a basal plane (0001) can be grown.

It is still further possible that the first, second and third GaN system compound semiconductor materials mainly include ones selected from the group consisting of GaN, GaInN, AlGaN and AlGaInN.

It is yet further possible that the first, second and third hexagonal crystal structures are identical, and basal planes of the first, second and third hexagonal crystal structures are parallel to each other and the first.

It is further more possible that the first and third GaN system compound semiconductor materials of the first and second cladding layers are identical with each other.

The active layer may comprise a single quantum well layer.

Alternatively, the active layer may comprise multiple quantum well layers. In this case, it is possible that the multiple quantum well layers comprise alternating laminations of GaInN well layers and AlGaN potential barrier layers.

In addition, it is preferable that the first and second compound semiconductor epitaxial layers are made of GaN system compound semiconductor materials which have hexagonal crystal structures of basal planes tilted from a (0001) plane by an angle in the range of 0 degree to a few degrees, and the basal planes are substantially parallel to interfaces of the active layer to the first and second cladding layers. In this case, it is further preferable that the GaN system compound semiconductor materials of the first and second compound semiconductor epitaxial layers mainly include ones selected from the group consisting of GaN, GaInN, AlGaN and AlGaInN, provided that the first and second compound semiconductor epitaxial layers are smaller in energy band gap than the first and second cladding layers.

The present invention also provides a light emission device comprising the following constitutional elements. A semiconductor buffer layer is provided on a substrate. A first compound semiconductor epitaxial layer of a first conductivity type is provided on the semiconductor buffer layer which has first and second areas apart from each other. A first electrode is provided on the first area of the first compound semiconductor epitaxial layer. A GaN system compound semiconductor double heterostructure is provided on the second area of the first compound semiconductor epitaxial layer to be spaced apart from the first electrode. The GaN system compound semiconductor double heterostructure comprises the following three layers. A first cladding layer of the first conductivity type is provided on the semiconductor buffer layer. The first cladding layer is made of a first GaN system compound semiconductor material which has a first energy band gap. An active layer is provided on the first cladding layer. The active layer is made of a second GaN system compound semiconductor material which has a second energy band gap being smaller than the first energy band gap of the first cladding layer. A second cladding layer of a second conductivity type is provided on the active layer. The second cladding layer is made of a third GaN system compound semiconductor material which has a third energy band gap larger than the second energy band gap of the active layer. A second compound semiconductor epitaxial layer of the second conductivity type is provided on the second cladding layer. A second electrode is provided in contact with the second compound semiconductor epitaxial layer.

It is important for the present invention that the first, second and third GaN system compound semiconductor materials have first, second and third hexagonal crystal structures of basal planes tilted from a (0001) plane by an angle in the range of 0 degree to a few degrees, and the basal planes are substantially parallel to interfaces of the active layer to the first and second cladding layers.

The GaN system compound semiconductor double heterostructure may have a pair of opposite resonance faces vertical to a direction in which a light is emitted, and for each of the first, second and third hexagonal crystal structures, a pair of opposite planes in the six planes vertical to the basal plane may form the opposite resonance faces. In this case, it the pair of opposite planes in the six planes vertical to the basal plane comprises (10-10) plane and (-1010) plane. Alternatively, the pair of opposite planes in the six planes vertical to the basal plane may comprise (01-10) plane and (0-110) plane. Further alternatively, that the pair of opposite planes in the six planes vertical to the basal plane may comprise (-1100) plane and (1-100) plane.

As illustrated in FIGS. 2A and 2B, the hexagonal crystal structure has a basal plane which is tilted from a (0001) plane by an angle in the range of 0 degree to a few degrees. The (0001) plane may be defined as a plane from which three dangling bonds of the Group-V element or N are extend upwardly or in an opposite direction to the substrate. As illustrated in FIG. 2A, a direction vertical to interface of the active layer to the first or second cladding layer is defined as an orientation (0001). In this case, there are three orientation vectors (1000), (0100), and (0001), each of which is vertical to the orientation (0001). In the hexagonal crystal structure, a surface orientation is defined by four Miller indices. FIG. 2B illustrates a plane view of the hexagonal crystal structure has a basal plane of (0001). Group-III elements form a top atomic layer of the hexagonal crystal on crystal growth. Group-V elements, or N, form a second top atomic layer of the hexagonal crystal on crystal growth. Group-III elements forming the top atomic layer are bonded via three dangling bonds to Group-V elements, or N, forming the second top atomic layer.

It will be considered as one example to carry out a selective growth of GaN using a mask having an opening of a circle. In this case, a hexagonal pillar of GaN is grown, which has a basal plane of (0001) and six planes vertical to the basal plane wherein a crystal growth rate of GaN on the six vertical planes is much slower than a crystal growth rate of GaN on the basal plane. That is why a metal organic vapor phase epitaxy is normally used to grow a GaN hexagonal crystal structure on a Group-V stabilized plane having been formed by supplying an excess amount of Group-V element gas at an initial time interval. On the basal plane (0001), nitrogen atoms as Group-V element forms a stabilized plane from which three dangling bonds of each of nitrogen atoms are projected upwardly. When Group-III elements are arrived on the Group-V element plane projecting upwardly three dangling bonds of each of nitrogen atoms, then Group-III elements will be bonded at a high probability or a high bonding coefficient. By contrast, the hexagonal crystal structure of GaN has the six planes vertical to the basal plane projecting outwardly two dangling bonds of each of nitrogen atoms, wherein the six vertical planes comprise a (10-10) plane, a (-1010) plane, a (01-10) plane, a (0-110) plane, a (-1100) plane and a (1-100) plane. Since two dangling bonds of each Group-V element, N, are projected from the six vertical planes, a bonding probability of Group-III elements to Group-V element on the six vertical plane is lower than when Group-III elements are bonded to Group-V element on the basal plane. Further there is a possibility that Group-III elements once bonded to Group-V elements on the six vertical planes will be eliminated therefrom. For those reasons, a probability of bonding Group-III elements to Group-V elements on the basal plane is much higher than a probability of bonding Group-III elements to Group-V elements on the six vertical planes. As a result, the hexagonal crystal of GaN having a basal plane (0001) can be grown.

The first, second and third GaN system compound semiconductor materials may mainly include ones selected from the group consisting of GaN, GaInN, AlCaN and AlGaInN.

The first, second and third hexagonal crystal structures may be identical, and basal planes of the first, second and third hexagonal crystal structures may be parallel to each other and the first.

The first and third GaN system compound semiconductor materials of the first and second cladding layers may be identical with each other.

The active layer may comprise a single quantum well layer.

The active layer may comprise multiple quantum well layers.

Alternatively, it is also possible that the multiple quantum well layers comprise alternating laminations of GaInN well layers and AlCaN potential barrier layers. In this case, it is preferable that the first and second compound semiconductor epitaxial layers are made of GaN system compound semiconductor materials which have hexagonal crystal structures of basal planes tilted from a (0001) plane by an angle in the range of 0 degree to a few degrees, and the basal planes are substantially parallel to interfaces of the first and second compound semiconductor epitaxial layers to the first and second cladding layers respectively. In this case, it is more preferable that the GaN system compound semiconductor materials of the first and second compound semiconductor epitaxial layers mainly include ones selected from the group consisting of GaN, GaInN, AlGaN and AlGaInN, provided that the first and second compound semiconductor epitaxial layers are smaller in energy band gap than the first and second cladding layers. Alternatively, it is still more preferable that the buffer layer is made of a GaN system compound semiconductor material which has a hexagonal crystal structure of a basal plane tilted from a (0001) plane by an angle in the range of 0 degree to a few degrees, and the basal plane is substantially parallel to an interface of the buffer layer to the first semiconductor compound epitaxial layer. In this case, it is yet more preferable that the GaN system compound semiconductor material of the buffer layer mainly includes one selected from the group consisting of GaN, GaInN, AlGaN and AlGaInN. In this case, it is moreover preferable that the GaN system compound semiconductor materials of the buffer layer and the first and second compound semiconductor epitaxial layers are identical.

PREFERRED EMBODIMENT

Figure 3:
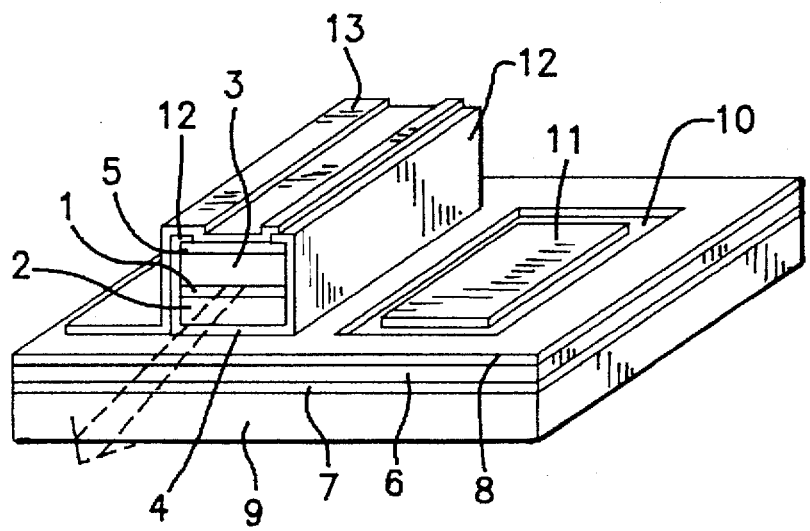
FIG. 3 is a schematic view illustrative of a laser emission device with a double heterostructure acting as a resonator made of GaN system compound semiconductors having a hexagonal crystal structure.

A preferred embodiment according to the present invention will be described with reference to FIG. 3. A GaN buffer layer 7 is grown at a low growth temperature on a sapphire substrate 9. An n-GaN epitaxial layer 6 is thickly grown on the GaN buffer layer 7. A $SiO_2$ mask 8 having a stripe-like opening is prepared on a surface of the n-GaN epitaxial layer 6. A resonance section of a laser device will selectively be formed. The mask 8 is aligned so that one of three pairs of opposite planes in the six planes vertical to the basal plane, for example, (10-10)/(-1010) planes, (01-10)/(0-110) planes, and (-1100)/(1-100) planes forms opposite resonance faces. The resonance section has a longitudinal length of a few hundred micrometers vertical to the resonance faces as well as a width of 5 micrometers for allowing a horizontal mode control. If the present invention is applied to a light emitting diode, the mask is so set that one of the above six planes vertical to the basal plane, for example, (10-10)/(-1010) planes, (01-10)/(0-110) planes, and (-1100) / (1-100) planes forms a surface from which a light is emitted. An n-GaN layer 4 is grown on the selective area of the n-GaN epitaxial layer 6. An n-AlGaN cladding layer 2 is grown on the n-GaN layer 4. A GaInN/AlGaN multiple quantum well active layer 1 is grown on the n-GaN cladding layer 2. A p-AlGaN cladding layer 3 is grown on the GaInN/AlGaN multiple quantum well active layer 1 to form a double heterostructure. A p-GaN layer 5 is grown on the p-AlGaN cladding layer 3.

A $SiO_2$ mask 12 is provided on a side face of the double heterostructure before a p-electrode 13 is provided. The $SiO_2$ mask is formed with an opening 10 before an n-electrode 11 is formed so that an electron injection in a horizontal direction is carried out.

It is possible to replace the above sapphire substrate with SiC, ZnO, GaN substrates.

The above described laser is fabricated as follows. A GaN buffer layer 7 is grown on a sapphire substrate 9 at a temperature of about 500° C. The substrate temperature is raised up to in the range of 1000° C. to 1100° C. so that an n-GaN epitaxial layer 6 is then grown on the GaN buffer layer 7. A SiO₂ mask 8 having an opening of 5×500 micrometers is provided on the n-GaN epitaxial layer 6. An n-GaN layer 4 having a thickness of 0.2 micrometers is selectively grown by metal organic vapor phase epitaxy on the area surrounded by the opening of the mask 8 at a growth temperature in the range of 1000° C. to 1100° C. An n-AlGaN cladding layer 2 having a thickness of 1 micrometer is grown on the n-GaN layer 4 by metal organic vapor phase epitaxy at the same growth temperature in the range of 1000° C. to 1100° C. A GaInN/AlGaN multiple quantum well active layer 1 is grown on the n-AlGaN cladding layer 2 by metal organic vapor phase epitaxy at the same growth temperature in the range of 1000° C. to 1100° C. The GaInN/AlGaN multiple quantum well active layer 1 comprises alternating laminations of four GaInN well layers having a thickness of 10 nanometers and three AlGaN potential barrier layers having a 5 nanometers. A p-AlGaN cladding layer 2 having a thickness of 1 micrometer is grown on the GaInN/AlGaN multiple quantum well active layer 1 by metal organic vapor phase epitaxy at the same growth temperature in the range of 1000° C. to 1100° C. A p-GaN layer 5 having a thickness of 0.3 micrometers is grown on the p-AlGaN cladding layer 2.

A SiO₂ mask 12 is provided to protect the side portions of the double heterostructure to prevent any current leakage. A p-electrode 13 is provided in contact with the p-GaN layer 5. An opening 10 is formed in the SiO₂ mask 12 over the n-GaN epitaxial layer 6 so that an n-electrode 11 is formed in contact with the n-GaN epitaxial layer 6.

The sapphire substrate 1 is cut by dicing the same to form a laser device which emits a blue or ultraviolet laser beam.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A GaN system compound semiconductor double heterostructure in a light emission device, said GaN system compound semiconductor double heterostructure including a resonator having a pair of opposite resonance faces perpendicular to a direction in which in which is emitted, said GaN system compound semiconductor double heterostructure comprising:

a selectively grown first cladding layer of a first conductivity type comprising a first GaN system compound semiconductor material having a first energy band gap;

a selectively grown active layer on said first cladding layer, said active layer comprising a second GaN system compound semiconductor material having a second energy band gap smaller than said first energy band gap of said first cladding layer; and a selectively grown second cladding layer of a second conductivity type on said active layer, said second cladding layer comprising a third GaN system compound semiconductor material having a third energy band gap larger than said second energy band gap of said active layer, wherein said first, second and third GaN system compound semiconductor materials have first, second and third hexagonal crystal structures of basal planes tilted from a (0001) plane by an angle in the range of 0 degrees to 3 degrees, each of said hexagonal crystal structures having six crystal planes, and said basal planes being substantially parallel to interfaces between said active layer and said first and second cladding layers, and wherein, said opposite resonance faces include, for each of said first, second and third hexagonal crystal structures, a pair of opposite planes in said six crystal planes which are perpendicular to said basal planes.

2. The GaN system compound semiconductor double heterostructure as claimed in claim 1, wherein said pair of opposite planes in said six planes vertical to said basal plane comprises (10-10) plane and (-1010) plane.

3. The GaN system compound semiconductor double heterostructure as claimed in claim 1, wherein said pair of opposite planes in said six planes vertical to said basal plane comprises (01-10) plane and (0-110) plane.

4. The (GaN system compound semiconductor double heterostructure as claimed in claim 1, wherein said pair of opposite planes in said six planes vertical to said basal plane comprises (-1100) plane and (1-100) plane.

5. The GaN system compound semiconductor double heterostructure as claimed in claim 1, wherein said first, second and third GaN system compound semiconductor materials mainly include ones selected from the group consisting of GaN, GaInN, AlGaN and AlGaInN.

6. The GaN system compound semiconductor double heterostructure as claimed in claim 1, wherein said first, second and third hexagonal crystal structures are identical, and basal planes of said first, second and third hexagonal crystal structures are parallel to each other and the first.

7. The GaN system compound semiconductor double heterostructure as claimed in claim 1, wherein said first and third GaN system compound semiconductor materials of said first and second cladding layers are identical with each other.

8. The GaN system compound semiconductor double heterostructure as claimed in claim 1, wherein said active layer comprises a single quantum well layer.

9. The GaN system compound semiconductor double heterostructure as claimed in claim 1, wherein said active layer comprises multiple quantum well layers.

10. The GaN system compound semiconductor double heterostructure as claimed in claim 9, wherein said multiple quantum well layers comprise alternating laminations of GaInN well layers and AlGaN potential barrier layers.

11. A resonator structure for emitting light in a light emission device, said resonator structure comprising:

a first compound semiconductor epitaxial layer of a first conductivity type;

a first electrode electrically connected to said compound semiconductor epitaxial layer;

a GaN system compound semiconductor double heterostructure on said first compound semiconductor epitaxial layer, spaced apart from said first electrode, said GaN system compound semiconductor double heterostructure including a resonator having a pair of opposite resonance faces perpendicular to a direction in which light is emitted, said GaN system compound semiconductor double heterostructure comprising:

a selectively grown first cladding layer of said first conductivity type on said semiconductor buffer layer, said first cladding layer comprising a first GaN system compound semiconductor material having a first energy band gap;

a selectively grown active layer on said first cladding layer, said active layer comprising a second GaN system compound semiconductor material having a second energy band gap smaller than said first energy band gap of said first cladding layer; and a selectively grown second cladding layer of a second conductivity type on said active layer, said second cladding layer comprising a third GaN system compound semiconductor material having a third energy band gap larger than said second energy band gap of said active layer, wherein said first, second and third GaN system compound semiconductor materials have first, second and third hexagonal crystal structures of basal planes tilted from a (0001) plane by an angle in the range of 0 degrees to 3 degrees, each of said hexagonal crystal structures having six crystal planes, and said basal planes being substantially parallel to interfaces between said active layer and said first and second cladding layers; and wherein, said opposite resonance faces include, for each of said first, second and third hexagonal crystal structures, a pair of opposite planes in said six crystal planes which are perpendicular to said basal planes, a second compound semiconductor epitaxial layer of said second conductivity type on said second cladding layer; and a second electrode electrically connected to said second compound semiconductor epitaxial layer.

12. The resonator structure as claimed in claim 11 wherein said pair of opposite planes in said six planes vertical to said basal plane comprises (10-10) plane and (-1010) plane.

13. The resonator structure as claimed in claim 11, wherein said pair of opposite planes in said six planes vertical to said basal plane comprises (01-10) plane and (0-110) plane.

14. The resonator structure as claimed in claim 11, wherein said pair of opposite planes in said six planes vertical to said basal plane comprises (-1100) plane and (1-100) plane.

15. The resonator structure as claimed in claim 11, wherein said first, second and third GaN system compound semiconductor materials mainly include ones selected from the group consisting of GaN, GaInN, AlGaN and AlGaInN.

16. The resonator structure as claimed in claim 11, wherein said first, second and third hexagonal crystal structures are identical, and basal planes of said first, second and third hexagonal crystal structures are parallel to each other and the first.

17. The resonator structure as claimed in claim 11, wherein said first and third GaN system compound semiconductor materials of said first and second cladding layers are identical with each other.

18. The resonator structure as claimed in claim 11, wherein said active layer comprises a single quantum well layer.

19. The resonator structure as claimed in claim 11, wherein said active layer comprises multiple quantum well layers.

20. The resonator structure as claimed in claim 11, wherein said multiple quantum well layers comprise alternating laminations of GaInN well layers and AlGaN potential barrier layers.

21. The resonator structure as claimed in claim 11, wherein said first and second compound semiconductor epitaxial layers are made of GaN system compound semiconductor materials which have hexagonal crystal structures of basal planes tilted from a (0001) plane by an angle in the range of 0 degree to a few degrees, and said basal planes are substantially parallel to interfaces of said active layer to said first and second cladding layers.

22. The resonator structure as claimed in claim 21, wherein said GaN system compound semiconductor materials of said first and second compound semiconductor epitaxial layers mainly include ones selected from the group consisting of GaN, GaInN, AlGaN and AlGaInN, provided that said first and second compound semiconductor epitaxial layers are smaller in energy band gap than said first and second cladding layers.

23. A light emission device comprising:

a substrate;

a semiconductor buffer layer on said substrate;

a first compound semiconductor epitaxial layer of a first conductivity type on said semiconductor buffer layer having first and second areas apart from each other;

a first electrode on said first area of said first compound semiconductor epitaxial layer;

a GaN system compound semiconductor double heterostructure on said second area of said first compound semiconductor epitaxial layer, spaced apart from said first electrode, said GaN system compound semiconductor double heterostructure including a resonator having a pair of opposite resonance faces perpendicular to a direction in which light is emitted, said GaN system compound semiconductor double heterostructure comprising:

a selectively grown first cladding layer of said first conductivity type on said semiconductor buffer layer, said first cladding layer comprising a first GaN system compound semiconductor material having a first energy band gap;

a selectively grown active layer on said first cladding layer, said active layer comprising a second GaN system compound semiconductor material having a second energy band gap smaller than said first energy band gap of said first cladding layer; and a selectively grown second cladding layer of a second conductivity type on said active layer, said second cladding layer comprising a third GaN system compound semiconductor material having a third energy band gap larger than said second energy band gap of said active layer, wherein said first, second and third GaN system compound semiconductor materials have first, second and third hexagonal crystal structures of basal planes tilted from a (0001) plane by an angle in the range of 0 degrees to 3 degrees, of said hexagonal crystal structures having six crystal planes, and said basal planes being substantially parallel to interfaces between said active layer and said first and second cladding layers; and wherein, said opposite resonance faces include, for each of said first, second and third hexagonal crystal structures, a pair of opposite planes in said six crystal planes which are perpendicular to said basal planes, a second compound semiconductor epitaxial layer of said second conductivity type on said second cladding layer; and a second electrode in contact with said second compound semiconductor epitaxial layer.

24. The resonator structure as claimed in claim 23, wherein said pair of opposite planes in said six planes vertical to said basal plane comprises (10-10) plane and (-1010) plane.

25. The resonator structure as claimed in claim 23, wherein said pair of opposite planes in said six planes vertical to said basal plane comprises (01-10) plane and (0-110) plane.

26. The resonator structure as claimed in claim 23, wherein said pair of opposite planes in said six planes vertical to said basal plane comprises (-1100) plane and (1-100) plane.

27. The resonator structure as claimed in claim 23, wherein said first, second and third GaN system compound semiconductor materials mainly include ones selected from the group consisting of GaN, GaInN, AlGaN and AlGaInN.

28. The resonator structure as claimed in claim 23, wherein said first, second and third hexagonal crystal structures are identical, and basal planes of said first, second and third hexagonal crystal structures are parallel to each other and the first.

29. The resonator structure as claimed in claim 23, wherein said first and third GaN system compound semiconductor materials of said first and second cladding layers are identical with each other.

30. The resonator structure as claimed in claim 23, wherein said active layer comprises a single quantum well layer.

31. The resonator structure as claimed in claim 23, wherein said active layer comprises multiple quantum well layers.

32. The resonator structure as claimed in claim 23, wherein said multiple quantum well layers comprise alternating laminations of GaInN well layers and AlGaN potential barrier layers.

33. The resonator structure as claimed in claim 23, wherein said first and second compound semiconductor epitaxial layers are made of GaN system compound semiconductor materials which have hexagonal crystal structures of basal planes tilted from a (0001) plane by an angle in the range of 0 degrees to 3 degrees, and said basal planes are substantially parallel to interfaces between said first and second compound semiconductor epitaxial layers and said first and second cladding layers, respectively.

34. The resonator structure as claimed in claim 33, wherein said GaN system compound semiconductor materials of said first and second compound semiconductor epitaxial layers mainly include ones selected from the group Consisting of GaN, GaInN, AlGaN and AlGaInN, provided that said first and second compound semiconductor epitaxial layers are smaller in energy band gap than said first and second cladding layers.

35. The resonator structure as claimed in claim 33, wherein said buffer layer is made of a GaN system compound semiconductor material which has a hexagonal crystal structure of a basal plane tilted from a (0001) plane by an angle in the range of 0 degree to a few degrees, and said basal plane is substantially parallel to an interface of said buffet layer to said first semiconductor compound epitaxial layer.

36. The resonator structure as claimed in claim 35, wherein said GaN system compound semiconductor material of said buffer layer mainly includes one selected from the group consisting of GaN, GaInN, AlGaN and AlGaInN.

37. The resonator structure as claimed in claim 36, wherein said GaN system compound semiconductor materials of said buffer layer and said first and second compound semiconductor epitaxial layers are identical.

* * * * *